United States Patent
Kim et al.

(10) Patent No.: US 6,815,350 B2
(45) Date of Patent: Nov. 9, 2004

(54) METHOD FOR FORMING A THIN FILM USING AN ATOMIC LAYER DEPOSITION (ALD) PROCESS

(75) Inventors: Young-Seok Kim, Suwon (KR); Yong-Woo Hyung, Yongin (KR); Man-Sung Kang, Suwon (JP); Jae-Young Ahn, Sungnam (JP)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 10/378,681

(22) Filed: Mar. 5, 2003

(65) Prior Publication Data

US 2003/0232514 A1 Dec. 18, 2003

(30) Foreign Application Priority Data

Mar. 5, 2002 (KR) .................... 10-2002-0011671

(51) Int. Cl.$^7$ ................... H01L 21/31; H01L 21/469; H01L 21/44
(52) U.S. Cl. .................... 438/680; 438/788; 438/792; 427/255.28
(58) Field of Search ................... 438/680, 788, 438/791, 792; 427/585, 255.28, 255.39

(56) References Cited

U.S. PATENT DOCUMENTS

2003/0082296 A1 * 5/2003 Elers et al. .................. 427/96

* cited by examiner

*Primary Examiner*—Alexander Ghyka
(74) *Attorney, Agent, or Firm*—Lee & Sterba, P.C.

(57) ABSTRACT

A method for forming a ternary thin film using an atomic layer deposition process includes supplying a first and a second reactive material to a chamber containing a wafer, the first and second reactive materials being adsorbing on a surface of the wafer, supplying a first gas to the chamber to purge the first and second reactive materials that remain unreacted, supplying a third reactive material to the chamber to cause a reaction between the first and second reactive materials and the third reactive material to form a thin film monolayer, supplying a second gas to purge the third reactive material that remains unreacted and a byproduct, and repeating the above steps for forming the thin film monolayer a predetermined number of times to form a ternary thin film having a predetermined thickness on the wafer. Preferably, the ternary thin film is a SiBN film.

15 Claims, 4 Drawing Sheets

METHOD FOR FORMING A THIN FILM USING AN ATOMIC LAYER DEPOSITION (ALD) PROCESS

BACKGROUND OF THE INVENTION

1. Field of the Invention

The present invention relates to a method for forming a thin film for a semiconductor device. More particularly, the present invention relates to a method for forming a ternary silicon boron nitride (SiBN) thin film having a low dielectric constant using an atomic layer deposition (ALD) process.

2. Description of the Related Art

Conventionally, a silicon nitride layer (SiNx) has been widely used in the manufacturing of semiconductor devices for several reasons. First, a SiNx layer has a high etching selectivity over a silicon oxide layer in a reactive ion etching (RIE) process and a wet etching process. Second, a SiNx layer exhibits strong oxidation and abrasion resistances. Third, a SiNx layer has an excellent diffusion barrier characteristic. However, a SiNx layer has a high dielectric constant of about 7. This high dielectric constant causes a propagation delay since parasitic capacitance increases as a chip size is reduced.

Recently, in view of the above disadvantage of a SiNx layer, the SiNx layer has been replaced with a boron nitride (BN) layer having a relatively low dielectric constant as a dielectric layer for a semiconductor device. The BN layer is formed by an ALD process at a low temperature in a range of 200° C. to 550° C., so that a conformal BN layer is formed.

The BN layer formed using the ALD process has a low dielectric constant, between 2.2 and 5 depending on deposition conditions, thereby reducing the propagation delay in comparison with a SiNx layer having a dielectric constant of about 7.

However, an ALD BN layer has several disadvantages. For example, an ALD BN layer is easily hydrolyzed by moisture in the atmosphere, is wet etched by a high temperature wet chemical based on sulfuric acid $H_2SO_4$, and has poor oxidation resistance.

Further, a conventional SiBN layer formed by a plasma enhanced chemical vapor deposition (PECVD) process has poor step coverage.

SUMMARY OF THE INVENTION

In an effort to overcome the problems described above, it is a feature of an embodiment of the present invention to provide a method for forming a SiBN thin film having excellent step coverage and uniformity in thickness over an entire surface of a wafer using an atomic layer deposition (ALD) process.

It is another feature of an embodiment of the present invention to provide a method for forming a SiBN thin film having a low dielectric constant and a low etching rate over a high temperature wet chemical.

It is yet another feature of an embodiment of the present invention to provide a method for forming a SiBN thin film having an excellent reactive ion etching (RIE) characteristic.

In accordance with one aspect of the present invention, there is provided a method for forming a thin film for a semiconductor device using an atomic layer deposition process, including supplying a first reactive material and a second reactive material to a chamber having a wafer therein, thereby adsorbing the first reactive material and the second reactive material on a surface of the wafer, supplying a first gas to the chamber, thereby purging the first reactive material and the second reactive material that remain unreacted, supplying a third reactive material to the chamber, thereby causing a reaction between the first and second reactive materials and the third reactive material to form a monolayer of the thin film, supplying a second gas to the chamber, thereby purging the third reactive material that remains unreacted and a byproduct, and repeating the above steps for forming the monolayer of the thin film a predetermined number of times to form a ternary thin film having a desired thickness on the wafer.

Preferably, the ternary thin film is a SiBN thin film. The first reactive material preferably includes $BCl_3$, $BBr_3$, $B_2H_6$ or $BF_3$ gas and is supplied at a gas flow rate of 50 sccm. The second reactive material preferably includes $SiH_2Cl_2$, $SiCl_4$, $Si_2Cl_6$ or $SiH_4$ gas and is supplied at a gas flow rate of 60 sccm. Preferably, the first and second gases are an inert gas or $N_2$ gas. The first and second gases may be supplied at a same or different rate, and are preferably supplied into the chamber at a flow rate of about 750 sccm. The third reactive material is preferably one of $NH_3$ gas or $N_2H_2$ gas. As the third reactive material, $NH_3$ gas or, alternatively, a mixture of $N_2$ gas and $H_2$ gas is converted into free radicals by application of plasma, and then the free radicals along with any remaining gases, if any, are used as the third reactive material. The third reactive material is preferably supplied at a gas flow rate of 500 sccm. The third reactive material may be converted to plasma in the chamber using an inductive coupled plasma (ICP) generation process, a direct current (DC) plasma generation process, a radio frequency (RF) plasma generation process or a microwave plasma generation process to increase a reaction rate between the first and second reactive materials and the third reactive material. The wafer is preferably heated to a temperature in a range of about 400° C. to 600° C. and the chamber maintains an internal pressure in a range of about 1 to 3 torr.

BRIEF DESCRIPTION OF THE DRAWINGS

These and other features and advantages of the present invention will be readily apparent to those of ordinary skill in the art upon review of the detailed description that follows when taken in conjunction with the accompanying drawings, in which like reference numerals denote like parts, and in which.

DETAILED DESCRIPTION OF THE INVENTION

Korean Patent Application No. 2002-11671, filed on Mar. 5, 2002, and entitled: "Method for Forming Thin Film Using ALD," is incorporated by reference herein in its entirety.

Reference will now be made in detail to preferred embodiments of the present invention, an example of which is illustrated in the accompanying drawings.

Figure 1:
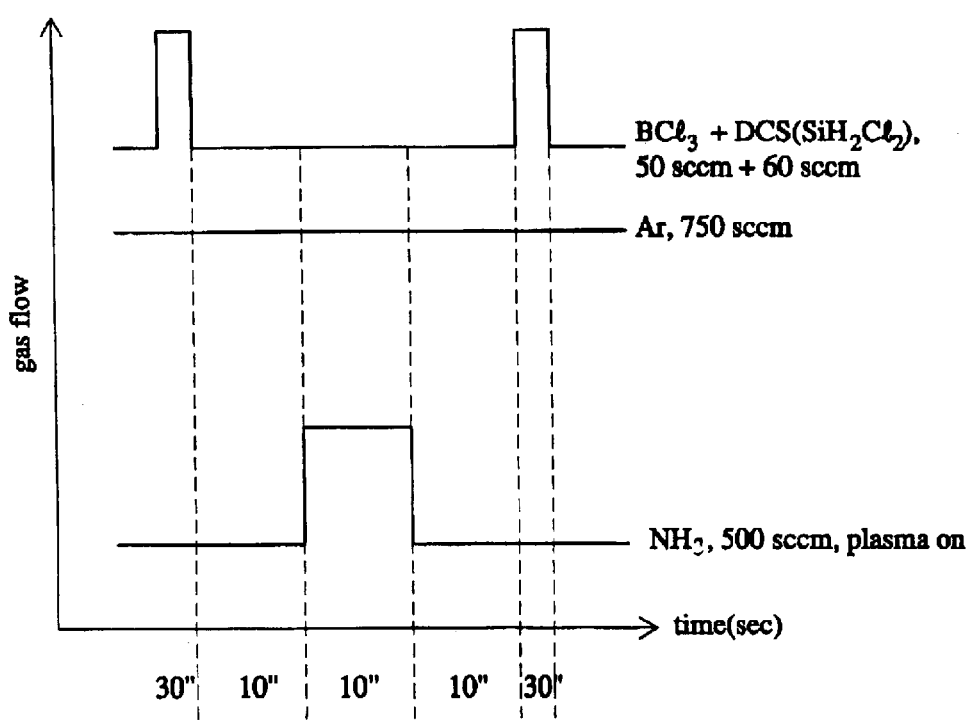
FIG. 1 is a graph showing a gas supplying sequence for forming a SiBN thin film in accordance with an embodiment of the present invention.

FIG. 1 is a graph showing a gas supplying sequence to form a SiBN monolayer in accordance with an embodiment of the present invention, wherein the x-axis indicates time periods for supplying gases at each step and the y-axis indicates-gas flow rates.

A method for forming a SiBN thin film according to an embodiment of the present invention will now be described with reference to FIG. 1.

First, a wafer, such as a single crystalline silicon substrate, on which a thin film is to be formed is loaded in a chamber (not shown). The chamber is equipped with a pump that is used for maintaining an internal pressure of the chamber below atmospheric pressure. Then, the wafer is heated to a temperature in a range of about 400° C. to 600° C. and the predetermined number of depositing cycles for depositing a thin film are proceeded. In this preferred embodiment of the present invention, the thin film deposited is a SiBN thin film.

In a first step, a first and a second reactive materials, each at a predetermined partial pressure, are supplied into the chamber for a predetermined time period, preferably 30 seconds and then they are sufficiently adsorbed onto a surface of the wafer to be saturated. At this time, the first reactive material as a source gas preferably includes $BCl_3$, $BBr_3$, $B_2H_6$ or $BF_3$. The second reactive material as a source gas preferably includes dichlorosilane (DCS, $SiH_2Cl_2$), hexa-chlorosilane (HCD, $Si_2Cl_6$), $SiCl_4$, or silane ($SiH_4$). The first and the second reactive materials are preferably supplied at gas flow rates of 50 sccm and 60 sccm, respectively.

In a second step, a first gas, preferably $N_2$ gas or an inert gas such as Ar or He, is supplied into the chamber at a flow rate of 750 sccm, thereby purging the first and second reactive materials that remain unreacted from the chamber. Therefore, partial pressures of the first and second reactive materials are lowered.

In a third step, a third reactive material, preferably $NH_3$ gas or, alternatively, a mixture of $N_2$ gas and $H_2$ gas, is introduced into the chamber at a predetermined partial pressure for a predetermined time period, preferably about 10 seconds. The third reactive material is reacted with the first reactive material and second reactive material adsorbed onto the surface of the wafer, thereby forming a SiBN mono layer comprised of silicon (Si), boron (B) and nitrogen (N) on the surface of the wafer. The third reactive material is preferably supplied at a gas flow rate of 500 sccm. At this step, it is preferable to increase a reaction rate between the first/second reactive materials and the third reactive material by converting the third reactive material to plasma in the chamber using an inductive coupled plasma (ICP) generation process, a direct current (DC) plasma generation process, a radio frequency (RF) plasma generation process or a microwave plasma generation process. The third reactive material is preferably one of $NH_3$ gas or $N_2H_2$ gas. As the third reactive material, a mixture of $N_2$ gas and $H_2$ gas or, alternatively, $NH_3$ gas is partially or completely converted into free radicals by application of plasma, and then the free radicals along with any remaining gases are used as the third reactive material.

In a fourth step, a second gas, preferably $N_2$ gas or an inert gas such as Ar or He, is introduced into the chamber, thereby purging the third reactive material that remains unreacted and a byproduct, such as HCl, from the chamber. The partial pressure of the second gas in the chamber is sufficiently lowered to perform this purge.

As described above, the process for depositing a SiBN monolayer includes four steps. The SiBN thin film is formed at a desired thickness by repeating this four-step cycle. In other words, the thickness of the SiBN monolayer deposited per 1 cycle by the ALD process is constant and therefore by repeating a predetermined number of times the cycle for depositing the SiBN monolayer, a SiBN thin film of a predetermined thickness may be formed.

In order to purge the gases that remain unreacted or the byproduct in the second and the fourth steps, the first and second gases, i.e., the purge gas, may be continuously introduced during the entire cycle, as shown in FIG. 1. Alternatively, the first and second gases may be introduced to the chamber only during the second and the fourth steps.

In the above-described cycle, preferably a chamber having a size of 7 liters is used. Further, the deposition process may be performed under a condition of a wafer temperature in a range of about 400° C. to 600° C. and an internal chamber pressure in a range of about 1 to 3 torr.

Figure 2:
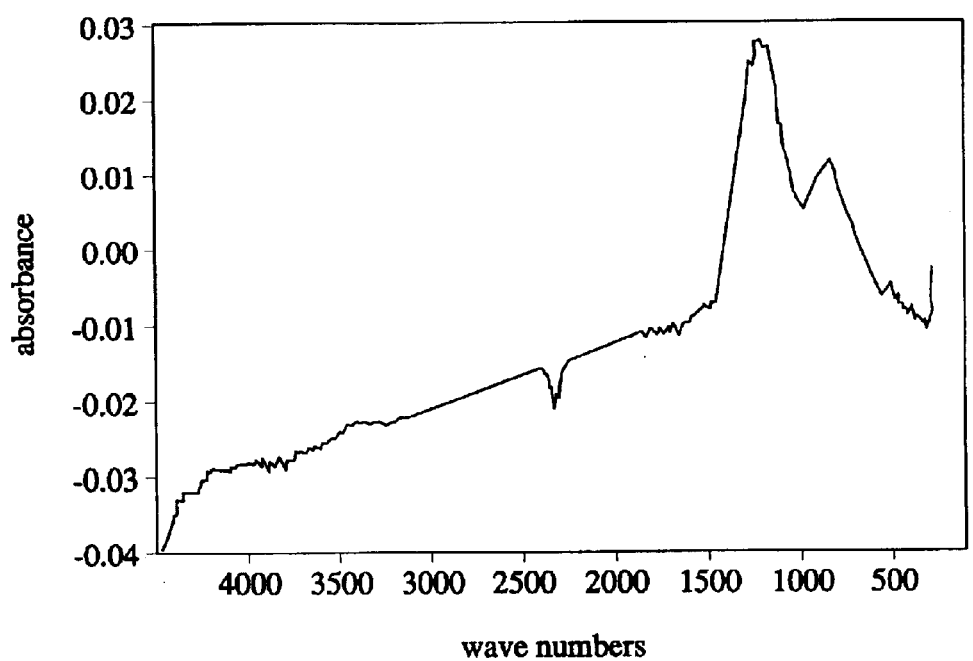
FIG. 2 is a graph showing FT-IR analysis of a SiBN thin film formed in accordance with an embodiment of the present invention.

FIG. 2 illustrates a Fourier transform infrared spectroscopy (FT-IR) analysis of a SiBN thin film formed in accordance with an embodiment of the present invention. Typically, a B-N band of a conventional BN film is 1370 $cm^{-1}$ and a Si-N stretching band of a conventional SiNx film is 1860 $cm^{-1}$. As shown in FIG. 2, from the ALD SiBN thin film, a B-N band and a Si-N stretching band are observed at 1310 $cm^{-1}$ and 910 $cm^{-1}$, respectively. Accordingly, it may be seen that the ALD SiBN thin film shown in FIG. 2 is a ternary film comprised of silicon (Si), boron (B), and nitrogen (N).

Figure 3:
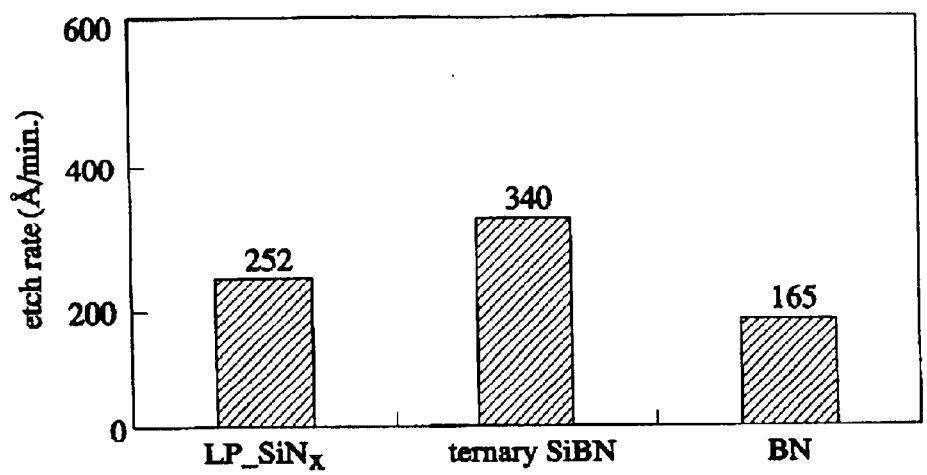
FIG. 3 is a graph showing comparative etching rates of a conventional SiNx layer formed by a LPCVD process, a SiBN thin film formed in accordance with an embodiment of the present invention and a conventional BN layer in a RIE etching process.

FIG. 3 is a graph showing comparative etching rates of a conventional SiNx film formed by a LPCVD process, a SiBN film formed in accordance with an embodiment of the present invention and a conventional BN film in a RIE etching process. The SiBN film in accordance with the present invention has an excellent RIE etching characteristic under the etching condition of $C_5F_8/CH_2F_2/AR/CO/O_2$, which is even greater than the conventional SiNx film, as shown in FIG. 3

Figure 4:
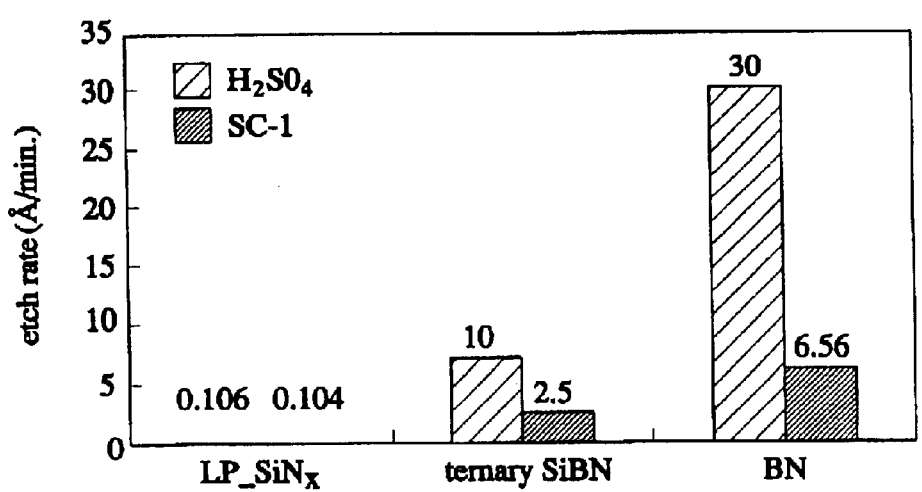
FIG. 4 is a graph showing comparative etching rates of a conventional LPCVD SiNx layer, the SiBN thin film formed in accordance with an embodiment of the present invention and a conventional BN layer in a wet etching process using a high temperature wet chemical of $H_2SO_4$ or SC-1.

FIG. 4 is a graph showing comparative etching rates of a conventional SiNx film formed by a LPCVD process, a SiBN film formed in accordance with an embodiment of the present invention and a conventional BN film in a wet etching processes using a high temperature wet chemical of $H_2SO_4$ or SC1. As shown in FIG. 4, the SiBN film in accordance with the present invention shows excellent etching rate over the high temperature wet chemical, $H_2SO_4$ or SC-1, in a wet etching process.

Figure 5:
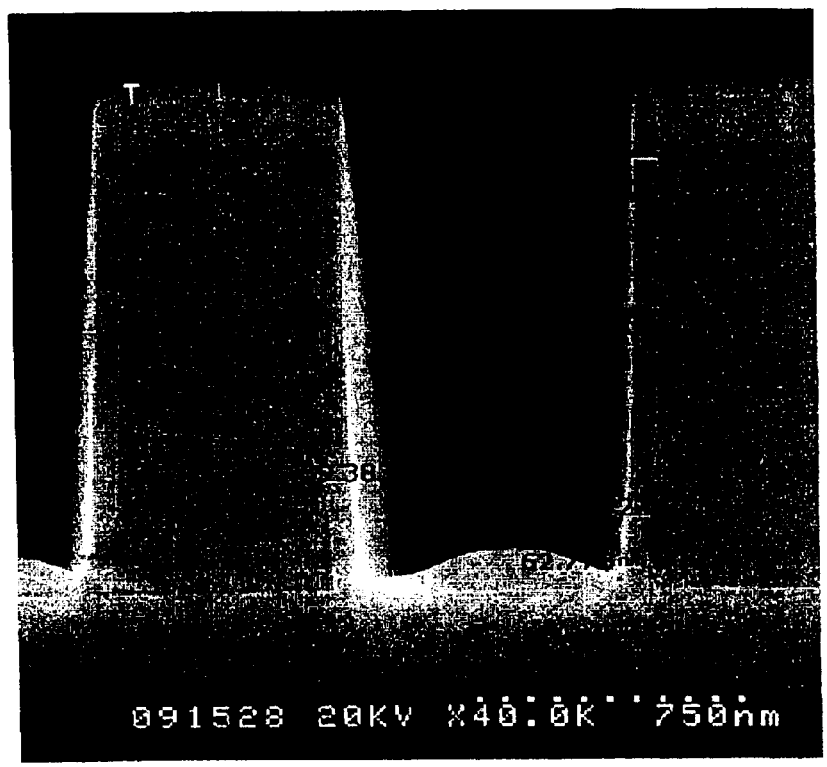
FIG. 5 is a scanning electron microscope photograph showing a step coverage of a SiBN thin film formed in accordance with an embodiment of the present invention.

FIG. 5 is a scanning electron microscope photograph showing a step coverage characteristic of a SiBN film in accordance with an embodiment of the present invention. FIG. 5 shows about 95% of good step coverage.

Figure 6:
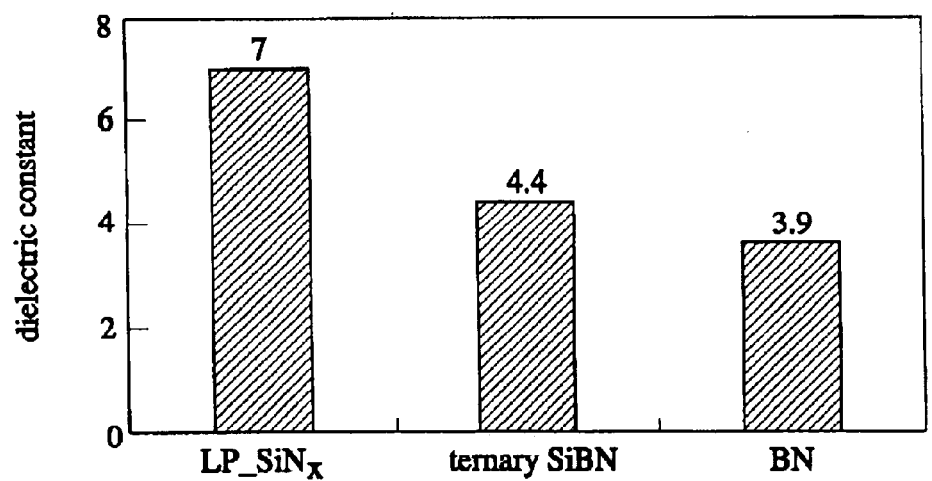
FIG. 6 is a graph comparing dielectric constants of a conventional SiNx layer formed by the LPCVD process, the ternary SiBN thin film formed in accordance with an embodiment of the present invention and a conventional BN layer.

FIG. 6 is a graph comparing a dielectric constant of a ternary SiBN thin film in accordance with an embodiment of the present invention wherein the ternary SiBN thin film has a low dielectric constant of about 4.4 while a conventional SiBN film formed by a LPCVD process has a high dielectric constant of about 7.

As described above, the SiBN thin film formed by the atomic layer deposition (ALD) process in accordance with an embodiment of the present invention has improved step coverage and thickness uniformity. Further, etching rates of the SiBN thin film in accordance with the present invention are improved in the RIE etching process and the high temperature wet chemical etching process as compared to a conventional SiBN film formed by a LPCVD process. Still further, a SiBN film in accordance with the present invention has a low dielectric constant, thereby reducing the propagation delay by decreasing the parasitic capacitance.

Preferred embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method for forming a thin film for a semiconductor device using an atomic deposition process, comprising:
   (a) supplying a first reactive material and a second reactive material to a chamber having a wafer therein, thereby adsorbing the first reative material and the second reactive material on a surface of the wafer;
   (b) supplying a first gas to the chamber to purge the first reactive material and the second reactive material that remain unreacted;
   (c) supplying a third reactive material to the chamber, thereby causing a reaction between the first and second materials and the third reactive material to form a monolayer of the thin film;
   (d) supplying a second gas to the chamber to purge the third reactive material that remains unreacted in the chamber and a byproduct; and
   (e) repeating (a) through (d) for forming the monolayer of the thin film a predetermined number of times to form a SiBN ternary thin film having a predetermined thickness on the wafer.

2. The method according to claim 1, wherein the first reactive material includes $BCl_3$, $BBr_3$, $B_2H_6$ or $BF_3$ gas.

3. The method according to claim 1, wherein the first reactive material is supplied at a gas flow rate of 50 sccm.

4. The method according to claim 1, wherein the second reactive material includes $SiH_2Cl_2$, $SiCl_4$, $Si_2Cl_6$ or $SiH_4$ gas.

5. The method according to claim 1, wherein the second reactive material is supplied at a gas flow rate of 60 sccm.

6. The method according to claim 1, wherein the first and second gases are an inert gas or $N_2$ gas.

7. The method according to claim 1, wherein the first and second gases are continuously introduced into the chamber during (a) through (d).

8. The method according to claim 1, wherein the first and second gases are introduced into the chamber only during (b) and (d), respectively.

9. The method according to claim 1, wherein the third reactive material is $NH_3$ or $N_2H_4$ gas.

10. The method according to claim 1, wherein the third reactive material is supplied at a gas flow rate of 500 sccm.

11. The method according to claim 1, wherein the third reactive material is $N_2$, $H_2$ and $NH_3$ gases and a mixture of these gases with a radical type.

12. The method according to claim 1, wherein the third reactive material is converted to plasma in the chamber by using an inductive coupled plasma (ICP) generation process, a direct current (DC) plasma generation process, a radio frequency (RF) plasma generation process or a microwave plasma generation process to increase a reaction rate between the first and second reactive materials and the third reactive material.

13. The method according to claim 1, wherein the wafer is heated to a temperature in a range of about 400° C. to 600° C. and the chamber maintains an internal pressure in a range of about 1 to 3 torr.

14. A method for forming a thin film for a semiconductor device using an atomic deposition process, comprising:
   (a) supplying a first reactive material and a second reactive material to a chamber having a wafer therein, thereby adsorbing the first reactive material and the second reactive material on a surface of the wafer;
   (b) supplying a first gas to the chamber to purge the first reactive material and the second reactive material simultaneously that remain unreacted;
   (c) supplying a third reactive material to the chamber, thereby causing a reaction between the first and second materials and the third reactive material to form a monolayer of the thin film;
   (d) supplying a second gas to the chamber to purge the third reactive material that remains unreacted in the chamber and a byproduct; and
   (e) repeating (a) through (d) for forming the monolayer of the thin film a predetermined number of times to form a ternary thin film having a predetermined thickness on the wafer,
   wherein the third reactive material is converted to plasma in the chamber by using an inductive coupled plasma (ICP) generation process, a direct current (DC) plasma generation process, a radio frequency (RF) plasma generation process or a microwave plasma generation process to increase a reaction rate between the first and second reactive materials and the third reactive material.

15. A method for forming a thin film for a semiconductor device using an atomic deposition process, comprising:
   (a) supplying a first reactive material and a second reactive material simultaneously to a chamber having a wafer therein, thereby adsorbing the first reactive material and the second reactive material on a surface of the wafer;
   (b) supplying a first gas to the chamber to purge the first reactive material and the second reactive material simultaneously that remain unreacted;
   (c) supplying a third reactive material to the chamber, thereby causing a reaction between the first and second materials and the third reactive material to form a monolayer of the thin film;
   (d) supplying a second gas to the chamber to purge the third reactive material that remains unreacted in the chamber and a byproduct; and
   (e) repeating (a) through (d) for forming the monolayer of the thin film a predetermined number of times to form a ternary thin film having a predetermined thickness on the wafer.

* * * * *